United States Patent [19]

Noda et al.

[11] Patent Number: 5,108,813
[45] Date of Patent: Apr. 28, 1992

[54] SLIDING MEMBER

[75] Inventors: Shoji Noda; Kazuo Higuchi; Masao Kohzaki, all of Aichi, Japan

[73] Assignee: Kabushiki Kaisha Toyota Chuo Kenkyusho, Aichi, Japan

[21] Appl. No.: 549,111

[22] Filed: Jul. 6, 1990

[30] Foreign Application Priority Data

Jul. 7, 1989 [JP] Japan ................... 1-176279

[51] Int. Cl.$^5$ ............................. B32B 15/00
[52] U.S. Cl. .................... 428/141; 428/212; 428/336; 428/408; 428/469
[58] Field of Search .............. 428/408, 469, 463, 336, 428/141, 212; 384/93, 907, 625, 907.1, 13

[56] References Cited

U.S. PATENT DOCUMENTS

| | | | |
|---|---|---|---|
| 3,001,838 | 9/1961 | Lamson et al. | 384/463 |
| 3,784,264 | 1/1974 | Jackson, Jr. | 384/93 |
| 3,882,584 | 5/1975 | Tsuya | 384/13 |
| 3,984,158 | 10/1976 | Sorensen et al. | 384/93 |
| 4,109,974 | 8/1978 | Svanstrom et al. | 384/93 |
| 4,172,395 | 10/1979 | Keller | 384/93 |
| 4,190,301 | 2/1980 | Lachonius et al. | 384/907.1 |
| 4,232,912 | 11/1980 | Williamson | 384/93 |
| 4,345,798 | 8/1982 | Cortés | 384/907.1 |
| 4,381,824 | 3/1983 | Pastusek | 384/93 |
| 4,553,417 | 11/1985 | Badger | 384/463 |
| 4,554,208 | 11/1985 | MacIver et al. | 428/408 |
| 4,582,368 | 4/1986 | Fujita et al. | 384/13 |
| 4,731,296 | 3/1988 | Kikuchi et al. | 428/408 |
| 4,797,011 | 1/1989 | Saeki et al. | 384/13 |
| 4,837,089 | 6/1989 | Araki et al. | 428/408 |
| 4,923,761 | 5/1990 | Shindo | 384/463 |

FOREIGN PATENT DOCUMENTS

| | | |
|---|---|---|
| 0327110 | 8/1989 | European Pat. Off. |
| 0057914 | 3/1988 | Japan . |
| 3163026 | 7/1988 | Japan . |
| 1-046018 | 2/1989 | Japan . |
| 2034417 | 6/1980 | United Kingdom . |

OTHER PUBLICATIONS

Oguri et al., "Low Friction Coatings of Diamond-Like Carbon with Silicaon Prepared by Plasma-Assisted Chemical Vapor Deposition" J. Mater. Res, vol. 5, No. 11, Nov. 1990, pp. 2567-2571.

*Primary Examiner*—Ellis P. Robinson
*Assistant Examiner*—Archene Turner
*Attorney, Agent, or Firm*—Oblon, Spivak, McClelland, Maier & Neustadt

[57] ABSTRACT

A sliding member which ensures a low coefficient of friction and a high degree of wear resistance, and is suitable for use in a bearing, mechanical seal, etc. It comprises a ceramic or metallic base, a diamond film formed on a surface of the base and having a rugged surface defining concavities, and a soft metal filling those concavities. When a relative sliding motion is made between it and a mating part formed from a hard material, only a low coefficient of friction occurs and the abrasive wear of the mating part is greatly reduced. It can maintain its high wear resistance for a long time even when it is used in a dry mode not involving the use of any lubricating oil, coolant, etc., since the diamond film does not undergo any change under heat to graphite having a lower degree of hardness.

3 Claims, No Drawings

SLIDING MEMBER

BACKGROUND OF THE INVENTION

1. Field of the Invention

This invention relates to a sliding member which includes a diamond film having a low coefficient of friction and a high degree of wear resistance, while not causing wear to any mating part, and which is particularly suitable for use in a bearing, mechanical seal, etc.

2. Description of the Related Art

Diamond is a very hard substance having a Vickers hardness of 8000 or more. Various attempts have, therefore, been made to coat the surface of a sliding member with diamond to improve its wear resistance. Any ordinary coating method, such as chemical vapor deposition (CVD), can, however, form only a film of diamond having a surface roughness of one micron or more. Diamond is so hard that a film thereof is very difficult to grind until it has a surface roughness not exceeding 0.5 micron. Moreover, if a sliding member has a sliding surface which is not flat, its grinding itself is difficult. The hard and rugged surface of a diamond film on a sliding member not only gives rise to a very high coefficient of friction, but also causes heavy abrasive wear to its mating part, which is likely to render the sliding member unsuitable for use.

If a sliding member having a sliding surface formed by a diamond film is used in a dry mode not involving the use of any lubricating oil, etc., the heat which is generated during sliding at a high temperature causes diamond to change to graphite having a lower degree of hardness, and the sliding surface, therefore, has a lower degree of wear resistance.

SUMMARY OF THE INVENTION

Under these circumstances, it is an object of this invention to provide a sliding member having a sliding surface with a diamond film, which has a low coefficient of friction (thus having improved PV characteristic, P being surface pressure, V being sliding velocity), which enables a reduction in the wear of a mating part, and which is so constructed as to prevent any change in quality of the diamond film, thus ensuring a long life of the sliding member.

There has been no effective conventional method for grinding diamond. There has only been a known method for grinding ceramics by sliding it against a member in which a large number of diamond particles are buried in a surface of a copper film formed on a base surface.

This object is attained by a sliding member which comprises a ceramic or metallic base, a diamond film formed on a surface of the base and having a rugged surface, and a soft metal filling concavities in the surface of the film.

As mentioned above, there has been a conventional sliding member for a hard ceramics in which hard diamond particles are buried in the soft metal such as copper. Contrary to such technical knowledge, according to the present invention, a soft metal such as copper and tin is buried in concavities of the surface of a hard diamond film.

When the sliding member of this invention is in sliding contact with a mating part which is made of a material having high hardness, only a low coefficient of friction occurs and a drastic reduction can be achieved in the abrasive wear of the mating part. When the sliding member is used in a dry mode not involving the use of any lubricating oil, coolant, etc., the diamond does not undergo any change under heat to graphite having a lower degree of hardness, but the sliding member can maintain a high degree of wear resistance for a long period of time. These advantages are apparently due to the mechanisms which will now be described.

When the sliding member and the mating part make a sliding motion relative to each other, the soft metal held in the concavities of the diamond film flows over the area in which their relative sliding motion takes place, thereby forming a thin film covering it and preventing any direct contact between the hard diamond film and the hard mating part. The film of the soft metal is soft enough to show only a small shearing force, and ensures that only a low coefficient of friction occur. The soft metal thus supplied flows back into the concavities again. The soft metal repeats these behaviors and thereby enables the maintenance of a low coefficient of friction for a long time. Moreover, it restrains the abrasive wear of the mating part by the hard and rugged surface of the diamond film.

These advantages make the sliding member of this invention useful for a wide range of application including its use in a bearing, or mechanical seal.

DETAILED DESCRIPTION OF THE INVENTION

The sliding member of this invention comprises a ceramic or metallic base, a diamond film formed on a surface of the base and having a rugged surface, and a soft metal filling concavities in the surface of the diamond film.

The base may be made of any ceramic or metallic material that is usually used to make a structural member, i.e., any material that is strong enough not to be heavily deformed by any external stress acting on a member or part made of it.

The ceramic base may be made of a ceramic material of the oxide, nitride or carbide type. Alumina, mullite, zirconia, silicon nitride and silicon carbide are examples of the material which can be used to make a ceramic base. The base may comprise a single crystal of any such material, a sintered product thereof, or a structural member coated with any such material.

The metallic base may be made of a metal such as molybdenum or tungsten, or stainless or other steel, such as SUS440C high-strength stainless steel or SUJ2 bearing steel.

It is recommended that the sliding member of this invention be used at a temperature not exceeding 800° C., as diamond lowers its strength at a temperature over 800° C. If the sliding member is intended for use at a temperature close to 800° C., it is effective to make its base of a high-melting metal such as molybdenum or tungsten, or a heat-resisting steel such as SUS310S. The base should, however, be made of a ceramic material if the sliding member is intended for use in any situation that is likely to cause the oxidation of any such metallic material. It is needless to say that no sliding member is allowed for use at any temperature exceeding the melting point of the soft metal filling the concavities in the surface of the diamond film.

The diamond film may be formed by any known film deposition method, such as a method employing a hot filament, an arc, DC, radio-frequency or microwave plasma, or a flame, sputtering, or ion plating. It has a Vickers hardness of 8000 or more.

The diamond film preferably has a thickness of, say, 0.5 to 100 microns. No film having a thickness which is smaller than 0.5 micron can be expected to hold the soft metal in a sufficiently large amount for achieving a low coefficient of friction, since its surface has too small or few concavities and the diamond particles define too small or few interstices. A film having a thickness larger than 100 microns is not expected to achieve any particularly low coefficient of friction or any particularly high wear resistance, but has the disadvantages that its formation requires a long time, and that it, as well as even the base, is likely to be strained.

The diamond film preferably has a surface roughness of 0.5 to 10 microns. No film having a surface roughness which is lower than 0.5 micron can satisfactorily hold the soft metal for maintaining a low coefficient of friction for a long time. A film having a surface roughness exceeding 10 microns is not expected to achieve any improved effect in holding the soft metal and supplying it to the area in which a sliding motion takes place, but is undesirably more likely to cause abrasive wear to a mating part. The film tends to have a high surface roughness, depending on the nature of the material which is deposited, and the conditions under which it is deposited, e.g., if a high rate of deposition is employed. It may attain a surface roughness of 0.5 to 10 microns if it is formed under normal conditions. Its surface roughness depends on its thickness, too, and usually becomes lower with a decrease in its thickness. A film having a thickness of, say, 0.5 micron has a surface roughness of 0.3 to 0.5 micron.

A diamond film formed by CVD usually has a surface roughness of, say, one to two microns. The film may be etched with a gas, such as hydrogen or oxygen, or an oxidizing solution, such as aqua regia, to form a mass of needlelike diamond crystals standing together in a large number. The film does not necessarily need to be a continuous or single layer, but may also be composed of independent diamond particles dispersed on the surface of the base if they are close enough to one another.

The spacing between the needlelike crystals or independent particles of diamond depends on the method and conditions which are employed for the treatment of the base prior to the deposition of diamond, the pressure, gas composition, time, and other conditions employed for the deposition, and the conditions for the etching of the diamond which has been deposited. Any magnitude of spacing, including zero, can be obtained if those conditions are appropriately controlled. A spacing of, say, 1 to 10 microns is, however, preferred. A spacing which is smaller than one micron defines too small concavities for stocking a sufficient supply of soft metal to the sliding surface. A spacing which is larger than 10 microns not only defines too large concavities for holding the soft metal properly, but also leaves the needlelike crystals or particles of diamond subject to so large a stress exerted by any surface contact that they may easily peel off.

The optimum conditions for film deposition depend on the method which is employed. The optimum gas to be employed and the optimum flow rate thereof differ from one method to another. The base on which a film is going to be deposited is preferably heated to a temperature of 500° C. to 1200° C. The composition of the gas can be varied to control the crystallinity and structure of the film which is formed. It is generally true that the use of a gas having a high carbon content results in a film of low crystallinity. If a gas comprising methane and hydrogen is used to form a film by an ordinary method of CVD, it is preferable to use a gas having a methane content not exceeding 10% and it is suitable to use a gas having a methane content of 2 to 5% in order to form needlelike diamond crystals.

If a diamond film having a relatively even surface has been formed by a method such as ion plating, it is advisable to roughen its surface, so that the soft metal may be held in its surface more effectively and thereby enable a lower coefficient of friction. Namely, the sliding characteristics can be improved by roughening the surface.

Other methods can also be employed for making a rugged diamond surface. If selected portions of the surface of the base are irradiated with ions prior to the deposition of diamond, it is possible to form a diamond film having a desired pattern of pores or a mass of diamond particles having a desired spacing, since no deposition of diamond occurs to any irradiated portion of the base. The same results can be obtained by the ion sputtering of selected portions of the surface of the base prior to the deposition of diamond. Microsputtering enables the microetching of a diamond film to a depth in the order of microns to form a surface having a rugged pattern. It is alternatively possible to form a diamond film having a desired rugged surface if, after the surface of a film as deposited has been ground smoothly, selected portions thereof are irradiated with ions for conversion to amorphous carbon, and if the amorphous carbon is removed by, for example, hydrogen gas etching.

A film of i-carbon (hard carbon) can be substituted for the diamond film. In such a case, however, it is most desirable to form a film having a Vickers hardness of at least 5000, as any film having lower hardness is liable to deformation or wear as a result of a sliding motion.

The soft metal filling the concavities in the surface of the diamond film need be sufficiently high in ductility to be capable of flowing over the sliding surface upon occurrence of a sliding motion to form a very thin film covering it. If the sliding member is intended for use in the air, the soft metal is most preferably one having high resistance to oxidation, since there is every likelihood that, if oxidized, it may become so hard and brittle as to fail to achieve a low coefficient of friction and a high degree of wear resistance. Preferred examples of the soft metal are Au, Ag, Pt, Cu, In, Sn, Pb and alloys mainly composed of these metals.

Any of various methods, such as vacuum evaporation, electron beam evaporation, sputtering, ionic plating, cluster ion beam evaporation, spray coating and plating, can be employed for placing the soft metal in the concavities. The soft metal can also be rubbed against the diamond film for filling the concavities.

The soft metal is preferably so placed as to not only fill the concavities, but also form a layer lying substantially in a flush relation to the projections on the surface of the diamond film, and even having a thickness of about one micron over those projections. If the amount of the soft metal which has been placed is too small to form a 'flush' layer, it is not sufficiently supplied to the sliding surface for achieving a low coefficient of friction and a high degree of wear resistance. Even if the soft metal placed over the projections may have a thickness of one micron or more, it is of little use, since it is rubbed away during the initial stage of any sliding motion unless it forms a flush layer. In such a case, it is even likely that the ploughing of the soft metal by the sliding member may give rise to a higher coefficient of friction.

The mating part may be one which is made of a relatively hard material having a Vickers hardness of at least 400, e.g., a ceramic material such as SiC, $Si_3N_4$ or $Al_2O_3$, an ultrahard alloy such as a WC-Co alloy, or a bearing steel such as SUJ2. It may be a sintered product of any such material or a hardened and tempered product thereof, or may alternatively comprise a coating of any such material formed on another material. Insofar as it is brought into contact with a very hard film of diamond, the mating part receives so large a stress that, if it is made of any material having a Vickers hardness lower than 400, it is easily deformed and abraded, resulting in a higher coefficient of friction.

dwell time were employed to form a diamond film having a thickness of 30 microns on each base. Then, the chamber was purged with oxygen as etching gas, and the surface of the diamond film was etched at a pressure of 20 torr to form needlelike crystals.

Then, a soft metal was deposited by vacuum evaporation in the concavities defined by the rugged surface of the diamond film. The evaporation was carried out by heating the diamond-coated base to a temperature of 300° C. in a vacuum chamber having a pressure of $10^{-6}$ torr, and employing gold or silver as the soft metal for Samples Nos. 1 to 8 and copper for Samples Nos. 9 and 10. The surface of the deposited metal was so ground as to leave a layer having a thickness of 0.1 micron over the tips of the projections on the surface of the diamond film, whereby a sliding member was obtained.

TABLE 1

Results of frictional wear tests in the air

| Sample No. | Film deposition method* | Diamond film Thickness (μm) | Diamond film Surface roughness (μm) | Soft metal | Mating part (of hard material) | Coefficient of friction | Specific wear of mating part ($mm^3/Nm$) |
|---|---|---|---|---|---|---|---|
| Example 1 | A | 30 | 1 | Au | SiC | 0.05 | $\sim 10^{-9}$ |
| Example 2 | A | 30 | 3 | Au | SiC | 0.05 | $\sim 10^{-9}$ |
| Example 3 | A | 30 | 5 | Au | SiC | 0.07 | $\sim 10^{-9}$ |
| Example 4 | A | 10 | 3 | Au | SiC | 0.05 | $\sim 10^{-9}$ |
| Example 5 | B | 30 | 5 | Au | SiC | 0.05 | $\sim 10^{-9}$ |
| Example 6 | B | 30 | 5 | Ag | SiC | 0.06 | $\sim 10^{-9}$ |
| Comparative C1 | A | 30 | 1 | | SiC | 0.5 | $\sim 10^{-7}$ |
| Comparative C2 | A | 30 | 3 | | SiC | 0.5 | $\sim 10^{-7}$ |
| Comparative C3 | A | 30 | 5 | | SiC | 0.6 | $\sim 10^{-7}$ |
| Comparative C4 | A | 10 | 3 | | SiC | 0.5 | $\sim 10^{-7}$ |
| Comparative C5 | B | 30 | 5 | | SiC | 0.7 | $\sim 10^{-7}$ |
| Example 7 | A | 30 | 3 | Au | WC | 0.03 | $\sim 10^{-8}$ |
| Example 8 | B | 30 | 5 | Au | WC | 0.04 | $\sim 10^{-8}$ |
| Comparative C6 | A | 30 | 3 | | WC | 0.2 | $\sim 10^{-6}$ |
| Comparative C7 | B | 30 | 5 | | WC | 0.4 | $\sim 10^{-6}$ |
| Example 9 | A | 20 | 2 | Cu | SiC | 0.05 | $\sim 10^{-9}$ |
| Example 10 | A | 20 | 2 | Cu | $Si_3N_4$ | 0.05 | $\sim 10^{-9}$ |
| Comparative C8 | A | 20 | 2 | | SiC | 0.3 | $\sim 10^{-7}$ |

*A - Method employing a hot filament
B - Method employing a microwave plasma

The invention will now be described more specifically with reference to examples thereof.

EXAMPLE 1

A plurality of samples embodying this invention were each prepared by employing as a base a sintered body of silicon carbide (SiC) measuring 50 mm square by 3 mm thick and having a surface roughness of 0.1 micron Rz. The surface of the base was coated with a diamond film formed by the method employing a hot filament (A) or a microwave plasma (B). The former method (A) was carried out by placing the base in a vacuum chamber, heating it to a temperature of 750° C., while maintaining a pressure of 500 torr in the chamber, and feeding the chamber with methane at a flow rate of 1 ml/min. and hydrogen at a flow rate of 200 ml/min. to form a mixed gas. Different lengths of dwell or reaction time were used to form a diamond film having a thickness of 10 to 30 microns and a surface roughness of 1 to 5 microns on each base, as shown in TABLE 1.

The latter method (B) was employed for preparing samples having a diamond film defined by a mass of needlelike crystals standing together. The base was placed in a vacuum chamber and heated to a temperature of 850° C., and a mixed gas of methane and hydrogen having a methane content of 3% was introduced at a flow rate of 100 ml/min. into the chamber in which a pressure of 40 torr was maintained. Different lengths of A frictional wear test was conducted on each sample of sliding member by employing as a mating part a sintered body of SiC or $Si_3N_4$ measuring 10 mm square by 3 mm thick and having a surface roughness, Rz, of 0.1 micron, or an equally sized body of an ultrahard alloy having a surface roughness, Rz, of 0.2 micron. The sliding member was mounted in a tester with its diamond film up, and the mating part was placed under load and caused to slide on the diamond film repeatedly at a constant speed. The conditions under which the test was conducted are shown in TABLE 2.

TABLE 2

| Conditions of frictional wear test | |
|---|---|
| Sliding speed | 200 mm/min. |
| Number of sliding motions | 1000 |
| Load (surface pressure) | 200 g (2 g/$mm^2$ or 1.96 × $10^4$ Pa) |
| Atmosphere | Air having a temperature of 25° C. and a relative humidity of 50% |

The coefficient of friction was calculated by dividing by the load the tangential force which had been exerted by the sliding motion, and measured by a load cell:

Coefficient of friction = Tangential force/Load.

The amount of wear of the mating part was obtained by determining a loss in weight of the mating part which had been tested, converting it to a loss in volume, and making the following calculation:

Specific wear = Loss in volume/Load × Sliding Distance

A plurality of comparative sliding members were each prepared by coating a sintered body of SiC with a diamond film formed by the same method (A) or (B), but not placing any soft metal in the concavities defined by the rugged surface of the film (Samples Nos. C1 to C8). The same frictional wear test was conducted on each of them under the same condition. The results are shown in TABLE 1.

As is obvious from TABLE 1, in the sliding members embodying this invention, a coefficient of friction was reduced to about one-tenth and a specific wear to about one-hundredth as compared with those of the comparative sliding members not including any soft metal.

Each of the mating parts which had been tested with the sliding members embodying this invention was found to retain a smooth surface, while all of the mating parts which had been tested with the comparative sliding members showed a large number of abrasive wear tracks on their sliding surfaces.

These results confirm the superiority of the sliding members according to this invention with respect to both a coefficient of friction and abrasive wear on the mating parts.

EXAMPLE 2

A couple of samples embodying this invention were each prepared by forming a diamond film having a thickness of 30 microns and a surface roughness of 1 or 3 microns on a sintered body of SiC as a base by the hot filament method (A), and depositing gold as a soft metal by vacuum evaporation in the concavities defined by the surface of the diamond film (Samples Nos. 11 and 12). The film deposition (A) and the vacuum evaporation were both carried out by following the procedures which had been employed in EXAMPLE 1. A couple of comparative samples not including any soft metal were also prepared (Samples Nos. C9 and C10). A frictional wear test was conducted on each sample by using a sintered body of SiC as a mating part, and following the procedures which had been employed in EXAMPLE 1, except that the test was carried out in a vacuum environment having a pressure of $1 \times 10^{-6}$ torr. The results are shown in TABLE 3. As is obvious therefrom, the sliding members embodying this invention exhibited superior results with respect to both a coefficient of friction and abrasive wear on the mating parts in a vacuum environment, too.

Tests were also conducted by using bases or mating parts formed from hard metallic materials, such as bearing steel. They again confirmed the superiority of this invention with respect to a coefficient of friction, etc.

TABLE 3

| | Results of frictional wear tests in a vacuum | | | | | |
|---|---|---|---|---|---|---|
| | | Diamond film | | | | |
| Sample No. | Film deposition method | Thickness ($\mu$m) | Surface roughness ($\mu$m) | Soft metal | Mating part (of hard material) | Coefficient of friction | Specific wear of mating part ($mm^3$/Nm) |
| Example 11 | By the method employing a hot filament | 30 | 1 | Au | SiC | 0.05 | $\sim 10^{-9}$ |
| Example 12 | | 30 | 3 | Au | SiC | 0.06 | $\sim 10^{-9}$ |
| Comparative C9 | | 30 | 1 | | SiC | 0.5 | $\sim 10^{-7}$ |
| Comparative C10 | | 30 | 3 | | SiC | 0.6 | $\sim 10^{-7}$ |

What is claimed is:

1. A sliding member comprising:
   a ceramic or metallic base;
   a diamond film formed on a surface of said base and having a rugged surface defining concavities, wherein said diamond film has a thickness of not less than 0.5 microns, and a surface roughness of 0.5 to 10 microns and a Vickers hardness Hv of not less than 8,000; and
   a soft metal filling said concavities, thereby reducing a coefficient of friction of said diamond film and wear of a mating material.

2. A sliding member as set forth in claim 1, wherein said diamond film has a thickness of 0.5 to 100 microns.

3. A sliding member as set forth in claim 1, wherein said soft metal is selected from the group consisting of gold, silver, platinum, copper, indium, tin, lead and alloys mainly composed of these metals.

* * * * *